US010312297B2

(12) United States Patent
Lee et al.

(10) Patent No.: US 10,312,297 B2
(45) Date of Patent: Jun. 4, 2019

(54) ORGANIC LIGHT EMITTING DISPLAY DEVICE AND TOUCH SENSING METHOD FOR THE SAME

(71) Applicant: LG Display Co., Ltd., Seoul (KR)

(72) Inventors: JaeGyun Lee, Paju-si (KR); JiHyun Jung, Paju-si (KR); SuChang An, Seoul (KR); Sangkyu Kim, Goyang-si (KR); Hyangmyoung Gwon, Paju-si (KR); Yangsik Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/391,772

(22) Filed: Dec. 27, 2016

(65) Prior Publication Data

US 2018/0097038 A1    Apr. 5, 2018

(30) Foreign Application Priority Data

Sep. 30, 2016    (KR) .......................... 10-2016-0127123

(51) Int. Cl.
*G06F 3/041* (2006.01)
*G06F 3/044* (2006.01)
*H01L 27/32* (2006.01)

(52) U.S. Cl.
CPC ............ *H01L 27/323* (2013.01); *G06F 3/044* (2013.01); *G06F 3/0412* (2013.01);
(Continued)

(58) Field of Classification Search
CPC .......... G09G 2300/0465; G06F 3/0412; G06F 3/0416; G06F 2203/04103
See application file for complete search history.

(56) References Cited

U.S. PATENT DOCUMENTS 9,715,313 B2 *    7/2017 Ye .......................... G06F 3/0412
2012/0168796 A1    7/2012 Moon et al.
(Continued)

FOREIGN PATENT DOCUMENTS

CN    101738761 A    6/2010
CN    102289310 A    12/2011
(Continued)

OTHER PUBLICATIONS

European Extended Search Report, European Application No. 16207514.7, dated Jun. 30, 2017, 9 pages.
(Continued)

*Primary Examiner* — Priyank J Shah
(74) *Attorney, Agent, or Firm* — Fenwick & West LLP

(57) ABSTRACT

Disclosed is an organic light emitting display device and a touch sensing method for the same. The organic light emitting display device includes a first driving electrode disposed on a portion of a first area of a display device, a second driving electrode disposed on a portion of a second area of the display device and connected to the first driving electrode, a first sensing electrode disposed on another portion of the first area and configured to correspond to the first driving electrode, and a second sensing electrode disposed on another portion of the second area and configured to correspond to the second driving electrode. An organic light emitting display device in which a thinner thickness is implemented and calculation of a touch point is performed more quickly by effectively transmitting a driving signal and a touch sensing method for the same is provided.

10 Claims, 10 Drawing Sheets

(52) U.S. Cl.
CPC ........ *G06F 3/0416* (2013.01); *H01L 27/3216* (2013.01); *H01L 27/3276* (2013.01); *G06F 2203/04103* (2013.01); *H01L 27/322* (2013.01)

(56) References Cited

U.S. PATENT DOCUMENTS

| | | | | |
|---|---|---|---|---|
| 2012/0255167 | A1* | 10/2012 | Badaye | G06F 3/044 29/846 |
| 2014/0145999 | A1* | 5/2014 | Den Boer | G06F 3/0412 345/174 |
| 2014/0160376 | A1* | 6/2014 | Wang | G06F 3/044 349/12 |
| 2014/0347319 | A1* | 11/2014 | Lin | G06F 3/044 345/174 |
| 2015/0261348 | A1* | 9/2015 | Jang | G06F 3/044 345/174 |
| 2016/0011690 | A1* | 1/2016 | Rowe | G06F 3/044 345/174 |
| 2016/0378224 | A1* | 12/2016 | Kwon | H01L 51/5256 345/174 |
| 2017/0003791 | A1* | 1/2017 | Berget | G06F 3/044 |
| 2017/0269440 | A1* | 9/2017 | Yoshitomi | G02F 1/134309 |
| 2017/0344187 | A1* | 11/2017 | Ko | G06F 3/0418 |
| 2018/0088707 | A1* | 3/2018 | Na | G02F 1/13338 |

FOREIGN PATENT DOCUMENTS

| | | | |
|---|---|---|---|
| CN | 103246422 | A | 8/2013 |
| CN | 104035624 | A | 9/2014 |
| EP | 2148264 | A2 | 1/2010 |
| JP | H06-318136 | A | 11/1994 |
| JP | 2014-049120 | A | 3/2014 |
| JP | 2014-096149 | A | 5/2014 |
| JP | 2015-176602 | A | 10/2015 |
| JP | 2016-524739 | A | 8/2016 |
| JP | 2017211638 | A * | 11/2017 ........... G02F 1/1368 |
| TW | I401498 | B | 7/2013 |
| TW | 201331669 | A | 8/2013 |
| TW | I456321 | B | 10/2014 |
| TW | I498797 | B | 9/2015 |
| WO | WO 2016/140282 | A | 9/2016 |

OTHER PUBLICATIONS

Taiwan First Office Action, Taiwan Application No. 105143706, dated Nov. 23, 2017, 16 pages.

Japanese Office Action, Japanese Application No. 2016-253090, dated Oct. 3, 2017, 6 pages.

* cited by examiner

ORGANIC LIGHT EMITTING DISPLAY DEVICE AND TOUCH SENSING METHOD FOR THE SAME

CROSS-REFERENCE TO RELATED APPLICATION

This application claims priority from Korean Patent Application No. 10-2016-0127123 filed on Sep. 30, 2016, which is hereby incorporated by reference for all purposes as if fully set forth herein.

BACKGROUND

Field

Exemplary embodiments of the present disclosure relate to an organic light emitting display device and a touch sensing method for the same.

Description of the Related Art

An organic light emitting display device is a display device which displays an image using organic light emitting diodes. The organic light emitting diode, which is a self-light-emitting element which emits light by itself, has a high response speed, high light emitting efficiency, high luminance, and a wide viewing angle.

Further, a display device may operate by receiving a user's commands through various input devices such as a keyboard, a mouse, and the like, and thus input devices to which a user can intuitively and conveniently input commands by touching a screen of the display device are being developed. To this end, a touch panel is disposed on a screen of a display device and is touched by a user who views the screen of the display device, and thus the display device may receive the user's command. However, when the touch panel is disposed on the display device, the display device may become thick and heavy due to the touch panel and visibility may be reduced due to reduction of luminance. Further, recently, due to the spread of mobile devices and the beauty of their appearance, there are attempts to implement thinner and lighter display devices.

Therefore, due to the above-described problem and recent trends, there are attempts to implement thinner display devices. To this end, a method of mounting a touch electrode on a display device through an additional process in a process of manufacturing the display device rather than a method of disposing a touch panel on the display device has been proposed.

However, since the touch electrodes mounted on the display device include a plurality of capacitors formed by disposing a plurality of layers on the display device to dispose a plurality of driving electrode lines and a plurality of sensing electrode lines, a plurality of layers are required and there is a limit in slimming the display device.

Further, driving signals are sequentially transmitted to respective driving electrode lines when a touch point is calculated. However, when a size of the display device is large, there is a problem in that it takes a long time to transmit the driving signals to respective driving electrode lines.

SUMMARY

The present disclosure has been made in an effort to provide an organic light emitting diode display device in which a thin thickness is implemented.

The present disclosure has been made in an effort to provide a touch sensing method for an organic light emitting display device in which calculation of a touch point is performed more quickly.

According to an aspect of the present disclosure, there is provided an organic light emitting display device. The organic light emitting display device includes a first driving electrode disposed on a portion of a first area of a display device, a second driving electrode disposed on a portion of a second area of the display device and connected to the first driving electrode, a first sensing electrode disposed on another portion of the first area and configured to correspond to the first driving electrode, and a second sensing electrode disposed on another portion of the second area and configured to correspond to the second driving electrode.

According to another aspect of the present disclosure, there is provided an organic light emitting display device. The organic light emitting display device includes a display device, a driving electrode disposed on the display device and including a first driving electrode and a second driving electrode which are driven by a first driving signal, a sensing electrode disposed on the display device and including a first sensing electrode configured to correspond to the first driving electrode and output a first sensing signal corresponding to the first driving signal and a second sensing electrode configured to correspond to the second driving electrode and output a second sensing signal corresponding to the first driving signal, and a touch driver integrated circuit (IC) configured to transmit the first driving signal to the driving electrode and receive the first sensing signal and the second sensing signal from the sensing electrode.

According to still another aspect of the present disclosure, there is provided a touch sensing method for an organic light emitting display device. The touch sensing method includes applying a first driving signal to a first driving electrode and a second driving electrode, which are disposed in a first area and a second area of a display device, sensing a first sensing signal from a first sensing electrode corresponding to a driving signal applied to the first driving electrode, and sensing a second sensing signal from a second sensing electrode corresponding to a driving signal applied to the second driving electrode, and calculating a touch point of the display device corresponding to the first sensing signal and the second sensing signal.

According to the exemplary embodiments of the present disclosure, an organic light emitting display device in which a thinner thickness is implemented can be provided.

Further, a touch sensing method for an organic light emitting diode display device in which calculation of a touch point is performed more quickly by effectively transmitting a driving signal can be provided.

BRIEF DESCRIPTION OF THE DRAWINGS

The above and other aspects, features and advantages of the present disclosure will be more clearly understood from the following detailed description taken in conjunction with the accompanying drawings.

DETAILED DESCRIPTION OF THE EMBODIMENTS

Figure 1:
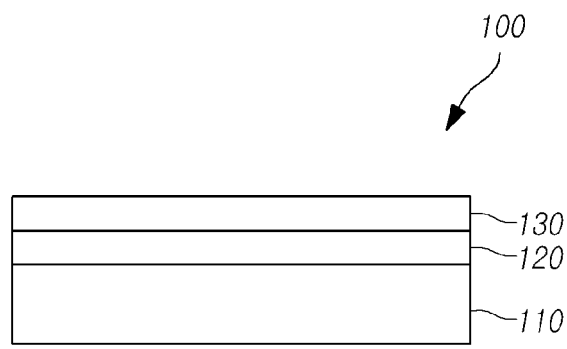
FIG. 1 is a cross-sectional view illustrating an exemplary embodiment of an organic light emitting display device according to the present exemplary embodiment.

Hereinafter, some exemplary embodiments of the present application will be described in detail with reference to the accompanying drawings. When reference numerals are assigned to components of each drawing, it should be noted that, even when the same components are illustrated in different drawings, the same numerals are assigned to the same components whenever possible. In addition, in descriptions of the present disclosure, when detailed descriptions of related well-known technology are deemed to unnecessarily obscure the gist of the disclosure, they will be omitted.

Further, in describing components of the present disclosure, terminologies such as first, second, A, B, (a), and (b) may be used. These terms are only used to distinguish one component from another component, but the nature, order, or number of the corresponding components is not limited by these terms. It will be understood that when an element is referred to as being "connected" or "coupled" to another element, it can be directly connected or coupled to another element, intervening elements may be present, or it can be connected or coupled to another element through the other element.

FIG. 1 is a cross-sectional view illustrating an exemplary embodiment of an organic light emitting diode display device according to the present exemplary embodiment.

Referring to FIG. 1, an organic light emitting diode display device 100 may include a first substrate 110, an organic film 120 deposited on the first substrate 110 which emits light, and a second substrate 130 which protects the organic film 120 deposited on the first substrate 110. The second substrate 130 may be bonded to the first substrate 110 by a sealing material (not illustrated) to seal the organic film 120, and thus may be referred to as a sealing substrate.

The first substrate 110 may include a plurality of pixel circuits (not illustrated) which selectively transmit a current to the organic film 120 to emit light in the organic film 120. However, the present disclosure is not limited thereto, and the first substrate 110 may be a substrate in which a plurality of pixel circuits are formed. In each of the pixel circuits, elements such as a plurality of transistors (not illustrated) and capacitors (not illustrated) may be formed. The first substrate 110 may be formed of an insulating material or a metal material.

The organic film 120 may be included in an organic light emitting diode, and the organic light emitting diode may receive a driving current from the pixel circuit and emit light to a corresponding pixel. The organic film 120 may be an organic compound layer which is formed on an anode electrode of the organic light emitting diode and a cathode electrode of the organic light emitting diode and formed between the anode and cathode electrodes. The organic compound layer may include a hole injection layer (HIL), a hole transport layer (HTL), an emission layer (EML), an electron transport layer (ETL), and an electron injection layer (EIL). Further, when a driving voltage is applied to the anode electrode and the cathode electrode by an operation of a pixel circuit, holes which pass through the HTL and electrons which pass through the ETL move to the EML to form excitons, and as a result, visible light may be generated in the EML.

The second substrate 130 may face and be bonded to the first substrate 110 to protect the organic film 120 from moisture or foreign matter. The second substrate 130 may have a thickness of 5 μm or more, and may be formed of an insulating material. Further, touch electrodes such as those illustrated in FIG. 3 may be disposed on the second substrate 130. That is, a separate touch panel is not formed on the second substrate 130, but the touch electrodes may be formed on the second substrate 130 so that the touch electrodes may be embedded in the display device.

Figure 2:
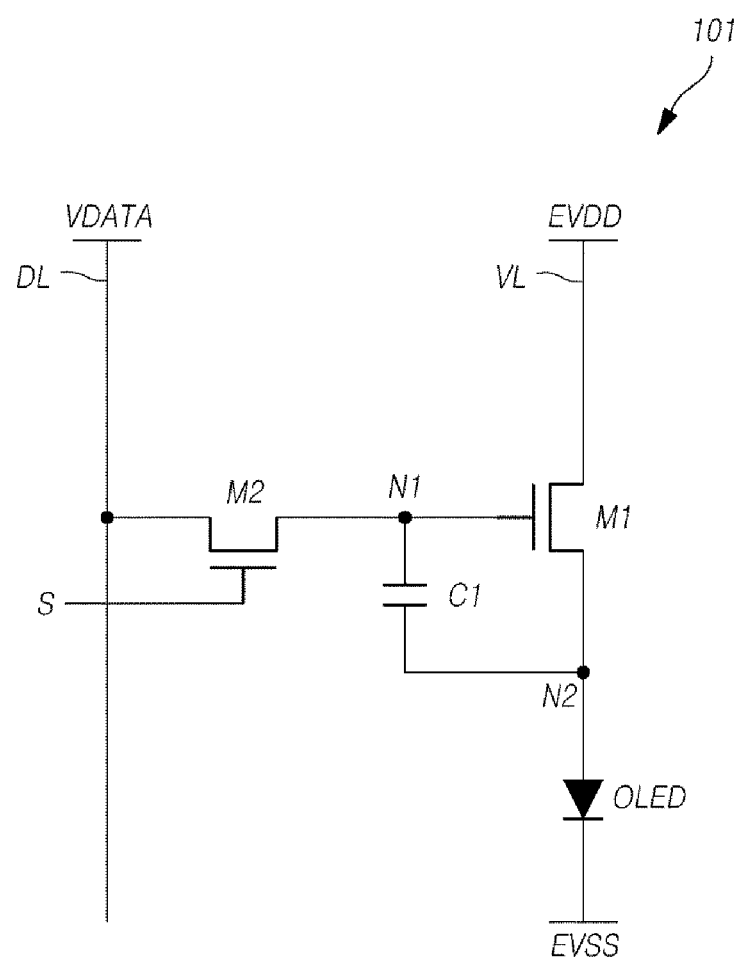
FIG. 2 is a circuit diagram illustrating an exemplary embodiment of a structure of a pixel used in the organic light emitting display device illustrated in FIG. 1.

FIG. 2 is a circuit diagram illustrating an exemplary embodiment of a structure of a pixel used in the organic light emitting diode display device illustrated in FIG. 1.

Referring to FIG. 2, the display device may include a plurality of pixels, and each of the pixels may include an organic light emitting diode OLED and a pixel circuit 101. The pixel circuit 101 may include first and second transistors M1 and M2 and a capacitor C1 and may control a current which flows in the organic light emitting diode OLED. Here, the first transistor M1 may be a driving transistor for driving the current which flows in the organic light emitting diode OLED. Further, a low potential voltage EVSS transmitted to a cathode electrode of the organic light emitting diode OLED may be a ground. However, the present disclosure is not limited thereto.

A first electrode of the first transistor M1 may be connected to a high potential voltage line VL to which a high potential voltage EVDD is transmitted, a second electrode thereof may be connected to an anode electrode of the organic light emitting diode OLED, and a gate electrode thereof may be connected to a first node N1. Further, the first transistor M1 may drive a driving current in a direction from the first electrode to the second electrode according to a voltage difference between the first electrode and the gate electrode. The driving current may be transmitted to the organic light emitting diode OLED so that the organic light emitting diode OLED may emit light.

A first electrode of the second transistor M2 may be connected to a data line DL to which a data voltage VDATA corresponding to a data signal is transmitted, a second electrode thereof may be connected to the first node N1, and a gate electrode thereof may be connected to a gate line S. The second transistor M2 may transmit the data voltage VDATA corresponding to a data signal, which is transmitted through the data line DL, to the first node N1 in response to a voltage of a gate signal transmitted through the gate line S.

The capacitor C1 may be disposed to connect the first node N1 and a second node N2 and may maintain a voltage applied to the gate electrode of the first transistor M1 by maintaining a voltage between the first node N1 and the second node N2.

The first electrodes of the first transistor M1 and the second transistor M2 may be drain electrodes, and the second electrodes thereof may be source electrodes. However, the present disclosure is not limited thereto. Further, although each of the transistors is illustrated as a p-channel metal-oxide semiconductor (PMOS) transistor, but the present disclosure is not limited thereto, and each of the transistors may be an n-channel metal-oxide semiconductor (NMOS) transistor. Here, a structure of the pixel circuit is only exemplary, but the present disclosure is not limited thereto.

Figure 3:
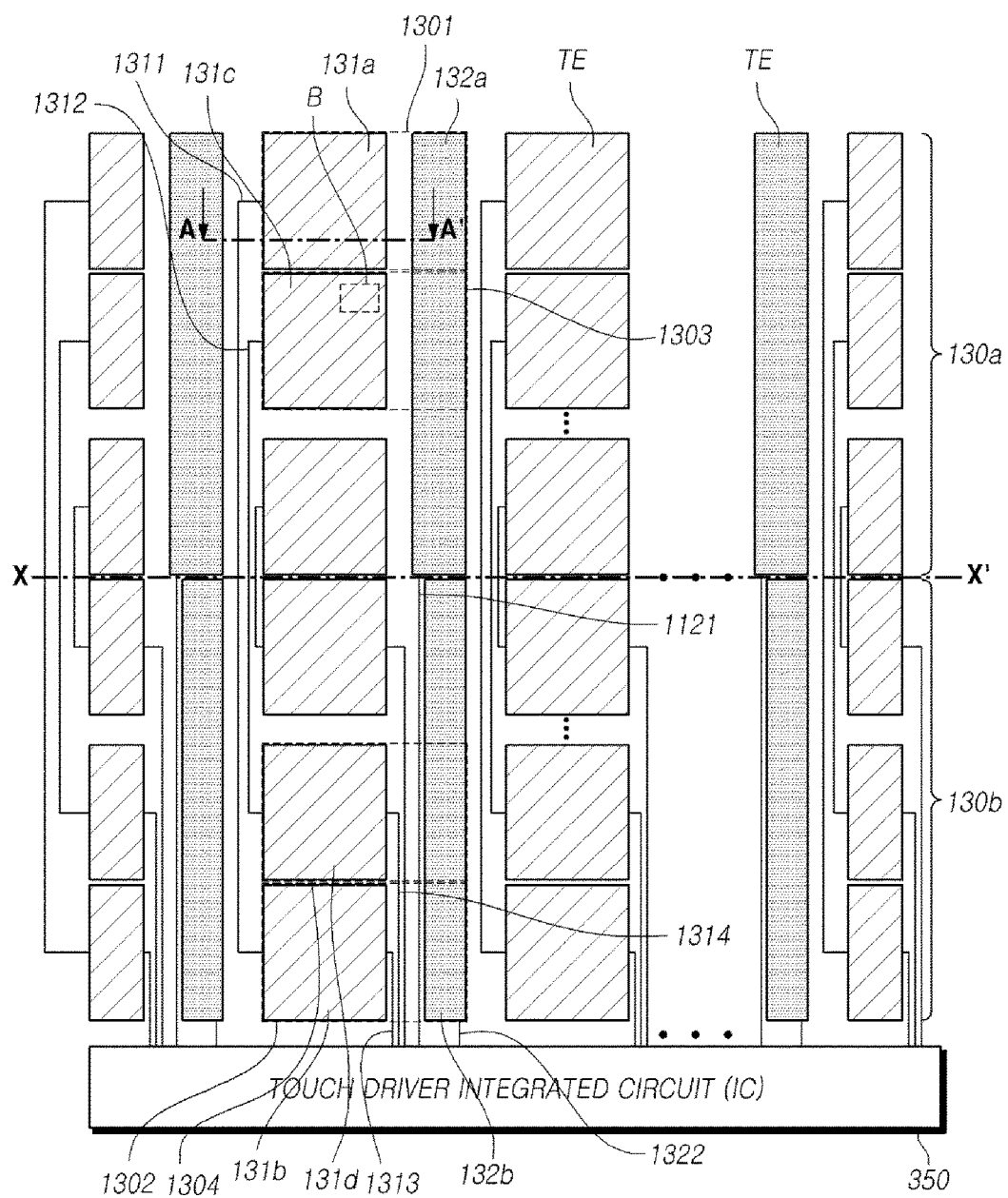
FIG. 3 is a plan view illustrating an exemplary embodiment of touch electrodes used in the organic light emitting diode display device according to the present exemplary embodiment.

FIG. 3 is a plan view illustrating an exemplary embodiment of touch electrodes used in the organic light emitting diode display device according to the present exemplary embodiment.

Referring to FIG. 3, a plurality of touch electrodes TE may be disposed on a second substrate.

The touch electrode TE may include a plurality of driving electrodes and a plurality of sensing electrodes. Further, a display device in which the touch electrodes TE are disposed may be divided into a plurality of areas, and the plurality of areas may include a first area 1301 and a third area 1303, which are disposed at an upper portion 130a of the display device based on a virtual central line X-X', and a second area 1302 and a fourth area 1304, which are disposed at a lower portion 130b of the display device. Further, a first driving electrode 131a may be disposed at a portion of the first area 1301, and a second driving electrode 131b may be disposed at a portion of the second area 1302. Further, a third driving electrode 131c may be disposed at a portion of the third area 1303, and a fourth driving electrode 131d may be disposed at a portion of the fourth area 1304. Further, a first sensing electrode 132a corresponding to the first driving electrode 131a may be disposed at another portion of the first area 1301, and a second sensing electrode 132b corresponding to the second driving electrode 131b may be disposed at another portion of the second area 1302. Further, the first sensing electrode 132a disposed at the other portion of the first area 1301 may extend and may be disposed at another portion of the third area 1303, and the second sensing electrode 132b disposed at the other portion of the second area 1302 may extend and may be disposed at another portion of the fourth area 1304.

Further, the first driving electrode 131a and the second driving electrode 131b may be connected by a first routing line 1311, and the third driving electrode 131c and the fourth driving electrode 131d may be connected by the second routing line 1312. That is, a pair of driving electrodes may be connected to a single routing line. Further, the second driving electrode 131b may be connected to a first driving line 1313 for transmitting a first driving signal, the first driving electrode 131a may receive the first driving signal through the first routing line 1311 transmitted to the second driving electrode 131b, the fourth driving electrode 131d may be connected to a second driving line 1314 for transmitting a second driving signal, and the third driving electrode 131c may receive the second driving signal through the second routing line 1312 transmitted to the fourth driving electrode 131d through the second driving line 1314.

Further, a first sensing line 1121 may be connected to the first sensing electrode 132a, and a second sensing line 1322 may be connected to the second sensing electrode 132b. Further, a driving line including the first driving line 1313 and the second driving line 1314 and a sensing line including the first sensing line 1121 and the second sensing line 1322 may be connected to a touch driver integrated circuit (IC) 350.

The touch driver IC 350 may apply a driving signal to the driving line including the first driving line 1313 and the second driving line 1314, and may receive a sensing signal corresponding to the driving signal through the first sensing line 1121 and the second sensing line 1322. When the touch driver IC 350 transmits a first driving signal to the second driving electrode 131b through the first driving line 1313, the first driving signal may be transmitted to the first driving electrode 131a connected to the second driving electrode 131b in a pair. Further, when the touch driver IC 350 transmits a second driving signal to the fourth driving electrode 131d through the second driving line 1314, the second driving signal may be transmitted to the third driving electrode 131c connected to the fourth driving electrode 131d in a pair. Since the sensing electrodes are divided into the first sensing electrode 132a and the second sensing electrode 132b in this way, two sensing signals corresponding to the driving signals transmitted in a pair may be output. By doing this, even when the number of driving signals applied to the driving electrodes is reduced, the sensing signals may be output to correspond to the number of driving electrodes. Therefore, the number of channels for outputting driving signals of the touch driver IC 350 may be reduced by half. By doing this, a time for which a driving signal is applied during a single touch sensing interval in the touch driver IC 350 may be reduced.

Figure 4:
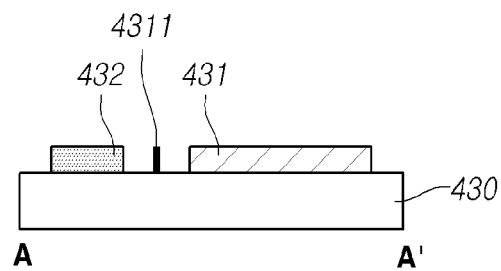
FIG. 4 is a cross-sectional view illustrating an exemplary embodiment of a display device in which the touch electrodes illustrated in FIG. 3 are formed.

FIG. 4 is a cross-sectional view illustrating an exemplary embodiment of the display device in which the touch electrodes illustrated in FIG. 3 are formed.

Referring to FIG. 4, a routing interconnection 4311, a first driving electrode 431, and a first sensing electrode 432 may be arranged on a second substrate 430 of the display device. That is, the first driving electrode 431 and the first sensing electrode 432 may be arranged in a single layer on the second substrate 430 rather than different layers thereon. That is, the routing interconnection 4311, the first driving electrode 431, and the first sensing electrode 432 may be formed by depositing and patterning a metal layer on a first insulating film. After the routing interconnection 4311, the first driving electrode 431, and the first sensing electrode 432 are patterned and formed, a second insulating film may be deposited thereon. Since the routing interconnection 4311, the first driving electrode 431, and the first sensing electrode 432 may be formed by depositing and patterning the metal layer, the routing interconnection 4311, the first driving electrode 431, and the first sensing electrode 432 may be formed of the same metal. Therefore, a thinner display device than that in which the first driving electrode 431 and the first sensing electrode 432 are arranged in different layers may be implemented.

Figure 5A:
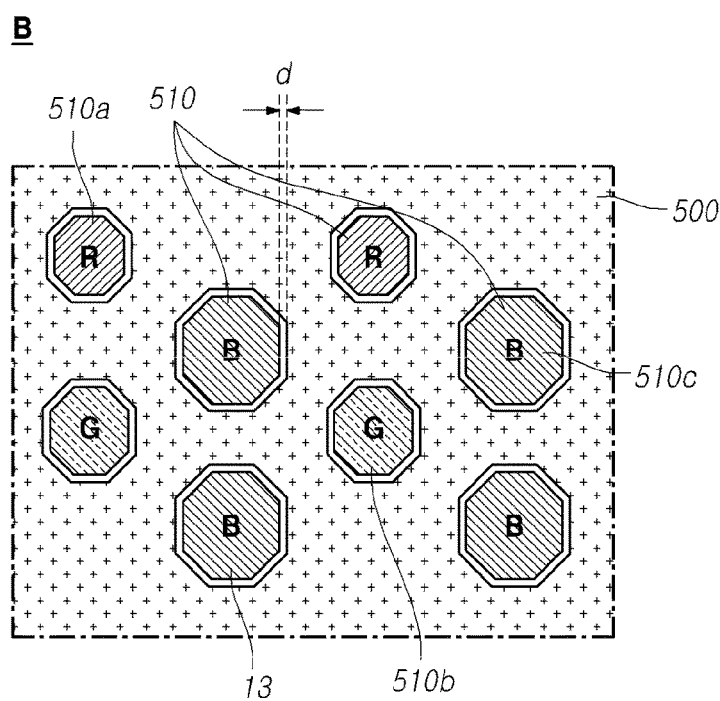
FIG. 5A is a plan view illustrating an exemplary embodiment of the touch electrodes illustrated in FIG. 3.
Figure 5B:
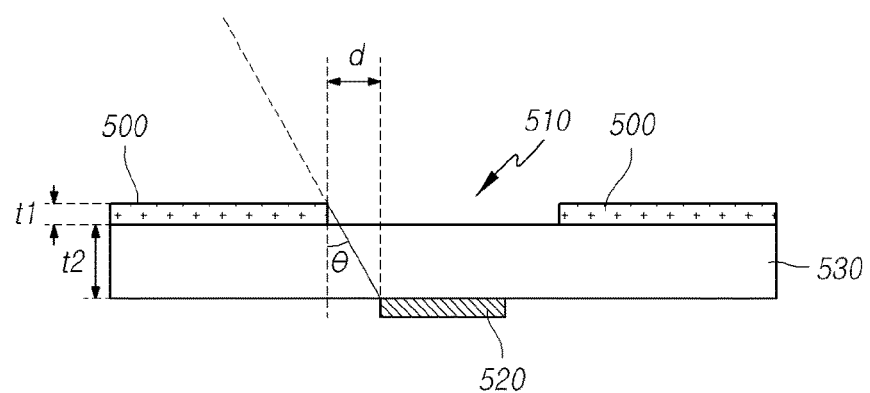
FIG. 5B is a cross-sectional view illustrating an exemplary embodiment of the touch electrodes illustrated in FIG. 3.

FIG. 5A is a plan view illustrating an exemplary embodiment of the touch electrodes illustrated in FIG. 3, and FIG. 5B is a cross-sectional view illustrating the exemplary embodiment of the touch electrodes illustrated in FIG. 3.

Referring to FIGS. 5A and 5B, an area B illustrated in FIG. 3 is illustrated. Here, the area B represents an area in which opening areas having different sizes are formed in the touch electrode. The area B is illustrated as being in a portion of the third driving electrode 131c in FIG. 3, but the present disclosure is not limited thereto, and the entire third driving electrode 131c may be formed as the area B and upper portions of the other driving electrodes and/or the other sensing electrodes may also have opening areas 510 as the area B.

Therefore, each touch electrode 500 may be formed of an opaque conductor, but light may be emitted by the opening areas 510 in the electrode. Further, the opening areas 510 may include an opening area 510a for emitting red light, an opening area 510b for emitting green light, and an opening area 510c for emitting blue light. Light passing through each of the opening areas 510 may correspond to a light emitting area corresponding to an organic film of an organic light emitting diode included in each pixel, and the organic light emitting diode may emit any one of red light, green light, and blue light to the light emitting area. Further, the organic light emitting diode which emits light through the opening area may emit white light, and color filters may be disposed in respective opening areas 510a, 510b, and 510c. The color filters may be formed to cover the opening areas or may be formed below the opening areas. Further, the opening areas 510 may be implemented to have a predetermined size and may be formed to have different sizes depending on colors of light to be emitted. That is, a size of the opening area 510a from which red light is emitted and a size of the opening area 510b from which green light is emitted are greater than a size of the opening area 510c from which blue light is emitted, and thus it is possible to compensate for blue light having a low emission efficiency and a short life span. However, the present disclosure is not limited thereto.

Further, as illustrated in FIG. 5B, the touch electrodes 500 may be formed to have a predetermined thickness t1, and a dielectric 530 may be positioned below the touch electrodes 500 to have a predetermined thickness t2. Further, an emission surface 520 for emitting light having a color from the opening area in which the touch electrode is not covered may be disposed below the dielectric 530. The emission surface 520 may correspond to an organic film of an organic light emitting diode and to an upper surface of a color filter. Further, a size of the opening area may be greater than a size of the light emitting area of the organic light emitting diode, or may be greater than sizes of the color filters disposed below the opening areas 510a, 510b, and 510c. Therefore, a gap d having a predetermined interval may be present between the touch electrode 500 and the light emitting area or the emission surface 520 corresponding to the upper surface of the color filter. The interval of the gap d may correspond to the sum of the thickness t1 of the touch electrode 500 and the thickness t2 of the dielectric 530. Further, the interval of the gap d may correspond to a half of the sum of the thickness t1 of the touch electrode 500 and the thickness t2 of the dielectric 530. When a size of the emission surface 520 disposed below the dielectric 530 is the same as the size of the opening area, the entire emission surface 520 exposed in the opening areas 510 may be visible to a user as seen in a front view of the display device, and by doing this, the color coordinates may not be distorted. However, an outer edge of the emission surface 520 exposed in the opening areas 510 is partially covered by the touch electrode 500 as seen in a side view rather than in a front view of the display device, a portion of the emission surface 520 is not exposed to a user's view, and thus the user viewing the display device in a side view may recognize that color coordinates of an image are distorted. However, when the size of the emission surface 520 is implemented to be smaller than the size of the opening area, since there is no portion covered by the touch electrode 500 in the light emitting area or the color filter even when the display device is viewed in a side view, it is possible to prevent a phenomenon in which color coordinates are distorted according to a viewing angle.

Here, the dielectric 530 may be a non-conductive material disposed between the light emitting area and/or the color filter and the touch electrode 500 disposed on the light emitting area and/or the color filter, and may be at least one of a passivation layer and an overcoating layer. However, the present disclosure is not limited thereto.

Figure 6:
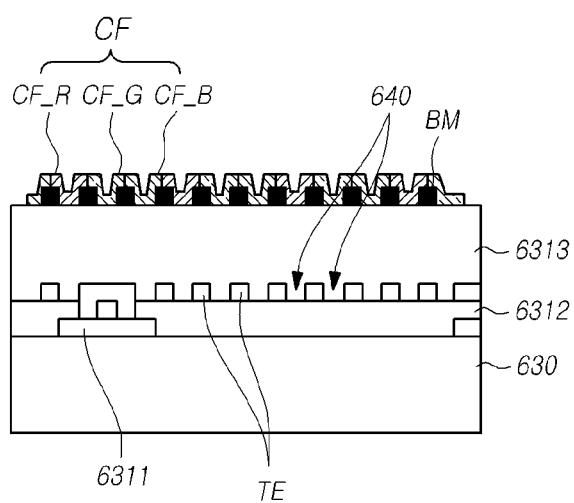
FIG. 6 is a cross-sectional view illustrating another exemplary embodiment of the touch electrodes illustrated in FIG. 3.

FIG. 6 is a cross-sectional view illustrating another exemplary embodiment of the touch electrodes illustrated in FIG. 3.

Referring to FIG. 6, a routing interconnection 6311 may be formed on a second substrate 630, and a passivation layer 6312 may be formed on the routing interconnection 6311. Further, touch electrodes TE may be formed on the passivation layer 6312. The touch electrode TE may include a driving electrode and a sensing electrode. Further, opening areas may be formed in the touch electrodes TE so that light emitted to a lower portion of the second substrate 630 may be emitted through the opening areas. Further, an overcoating layer 6313 may be deposited on the second substrate 630 in which the touch electrodes TE are formed. Further, a black matrix BM and color filters CF may be deposited on the deposited overcoating layer 6313. Since the touch electrodes including the driving electrodes and the sensing electrodes may be formed on the second substrate, that is, on the same layer, a thinner display device may be implemented.

In this case, since the color filters CF may be disposed on the touch electrodes and the color filters CF may not be covered by the touch electrodes, a problem due to a viewing angle may not occur. Further, since the black matrix BM is disposed to correspond to upper portions of the touch electrodes TE formed therebelow, an aperture ratio of the display device may be prevented from being reduced.

Figure 7:
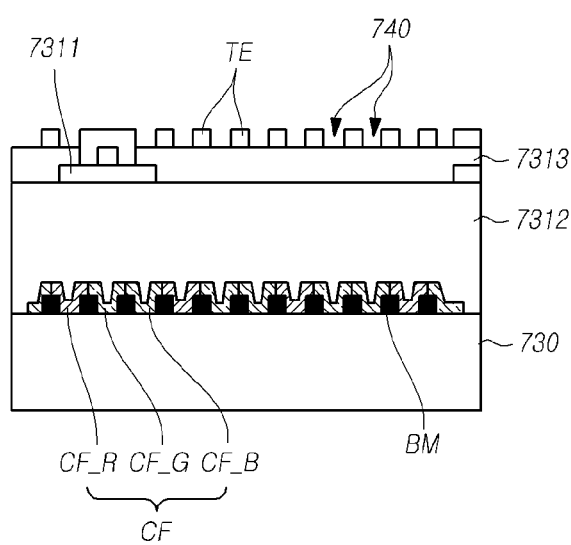
FIG. 7 is a cross-sectional view illustrating still another exemplary embodiment of the touch electrodes illustrated in FIG. 3.

FIG. 7 is a cross-sectional view illustrating still another exemplary embodiment of the touch electrodes illustrated in FIG. 3.

Referring to FIG. 7, a black matrix BM and color filters CF may be disposed on a second substrate 730, an overcoating layer 7312 may be deposited on the black matrix BM and the color filters CF, and a metal layer may be formed and patterned on the overcoating layer 7312 to form a routing interconnection 7311. Further, after a passivation layer 7313 is deposited on the routing interconnection 7311 and an upper portion of the passivation layer 7313 is planarized, a metal layer may be deposited and patterned to form touch electrodes TE. Opening areas 740 may be formed in the touch electrodes TE. Here, the opening areas 740 are illustrated as having a predetermined interval, but the present disclosure is not limited thereto. Further, the metal layers which form the routing interconnection 7311 and the touch electrodes TE may have the same material. Here, the routing interconnection 7311 and the touch electrodes TE are illustrated as being disposed on different layers on the second substrate 730, but the routing interconnection 7311 and the touch electrodes TE are only exemplary and may be disposed on the same layer.

In this case, since the color filters CF may be disposed below the touch electrodes TE, a size of a color filter CF corresponding to a single pixel should be smaller than a size of the opening areas 740.

Figure 8:
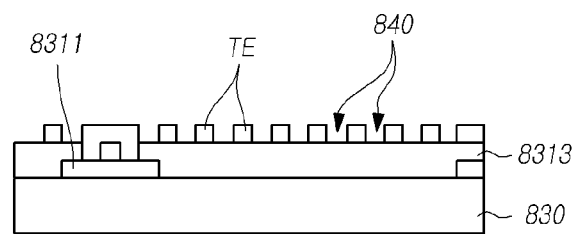
FIG. 8 is a cross-sectional view illustrating yet another exemplary embodiment of the touch electrodes illustrated in FIG. 3.

FIG. 8 is a cross-sectional view illustrating yet another exemplary embodiment of the touch electrodes illustrated in FIG. 3.

Referring to FIG. 8, a metal layer may be formed and patterned on a second substrate 830 to form a routing interconnection 8311. Further, after a passivation layer 8313 is deposited on the routing interconnection 8311 and an upper portion of the passivation layer 8313 is planarized, a metal layer may be deposited and patterned to form touch electrodes TE. Opening areas 840 may be formed in the touch electrodes TE. Here, the opening areas 840 are illustrated as having a predetermined interval, but the present disclosure is not limited thereto. Further, the metal layers which form the routing interconnection 8311 and the touch electrodes TE may have the same material. Here, the routing interconnection 8311 and the touch electrodes TE are illustrated as being disposed on different layers on the second substrate 830, but the routing interconnection 8311 and the touch electrodes TE are only exemplary and may be disposed on the same layer.

Figure 9:
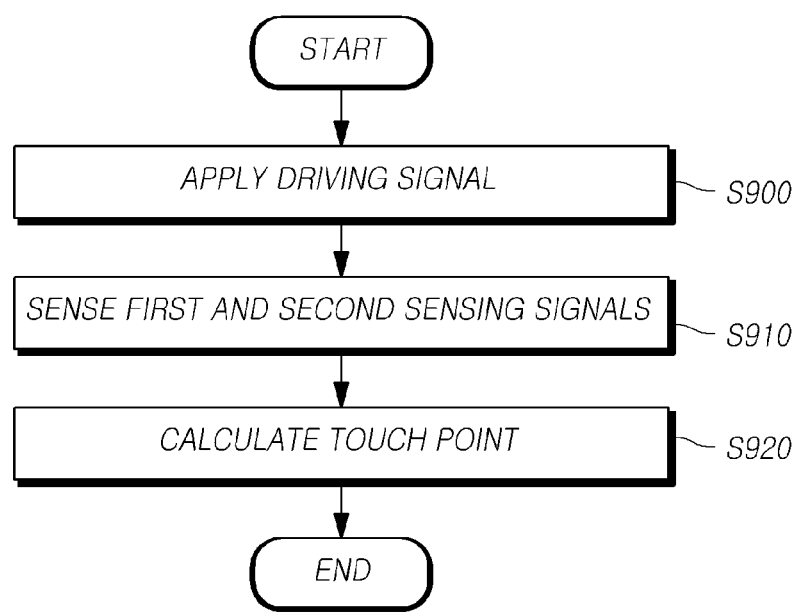
FIG. 9 is a flowchart illustrating an exemplary embodiment of a touch sensing method of sensing a touch in an organic light emitting display device including the touch electrodes illustrated in FIG. 3.

FIG. 9 is a flowchart illustrating an exemplary embodiment of a touch sensing method of sensing a touch in an organic light emitting diode display device including the touch electrodes illustrated in FIG. 3.

Referring to FIG. 9, the touch sensing method may include applying driving signals to a first driving electrode and a second driving electrode disposed in a first area and a second area of a display device which are different from each other. The first driving electrode and the second driving electrode may be connected in a pair, and a driving signal applied to the second driving electrode may be applied to the first driving electrode (S900). Therefore, even when a single driving signal is transmitted to a single driving electrode, two driving electrodes may receive the driving signal. Therefore, since the number of channels for outputting driving signals of the touch driver IC which outputs the driving signals may be reduced, a time for which a driving signal is applied to a plurality of driving electrodes during a single touch sensing interval may be reduced. Further, when the driving signal is applied to the driving electrode, a second driving signal may be applied to a third driving electrode and a fourth driving electrode, which are disposed in a third area adjacent to a first area of the display device and a fourth area adjacent to a second area.

Further, a first sensing signal corresponding to the driving signal applied to the first driving electrode may be sensed, and a second sensing signal corresponding to the driving signal applied to the second driving electrode may be sensed (S910). The first sensing electrode corresponds to the first driving electrode and the second sensing electrode corresponds to the second driving electrode, thereby outputting two sensing signals corresponding to a single driving signal. The sensing signals output from the sensing electrodes may be transmitted to the touch driver IC. Further, when the sensing signals are sensed, a third sensing signal corresponding to the second driving signal may be sensed from the first sensing electrode, and a fourth sensing signal corresponding to the second driving signal may be sensed from the second sensing electrode.

Further, touch points of the display device corresponding to the first sensing signal and the second sensing signal may be calculated (S920). The touch points may transmit the first sensing signal and the second sensing signal which are transmitted to the touch driver IC to a controller, and the controller may calculate information on the driving signals supplied to the touch driver IC and information included in the first sensing signal and the second sensing signal using a preset algorithm. The controller may be a specific controller for calculating a touch point and may be a timing controller for controlling the driving of the organic light emitting diode display device. However, the present disclosure is not limited thereto.

The above description is only an example describing the technological scope of the present disclosure. Various changes, modifications, and replacements may be made without departing from the spirit and scope of the present disclosure by those skilled in the field of display devices and touch sensing. Therefore, the exemplary embodiments disclosed above and in the accompanying drawings should be considered in a descriptive sense only and not for limiting the technological scope. The technological scope of the present disclosure is not limited by these embodiments or the accompanying drawings. The spirit and scope of the present disclosure should be interpreted by the appended claims and encompass all equivalents falling within the scope of the appended claims.

What is claimed is:

1. An organic light emitting display device comprising:
   a first driving electrode disposed on a portion of a first area of a display device;
   a second driving electrode disposed on a portion of a second area of the display device and connected to the first driving electrode;
   a third driving electrode disposed on a portion of a third area of the display device adjacent to the first area;
   a fourth driving electrode disposed on a portion of a fourth area of the display device adjacent to the second area and connected to the third driving electrode;
   a first sensing electrode disposed on another portion of the first area and another portion of the third area and configured to correspond to the first driving electrode and the third driving electrode; and
   a second sensing electrode disposed on another portion of the second area and another portion of the fourth area and configured to correspond to the second driving electrode and the fourth driving electrode,
   wherein a width of the second sensing electrode is narrower than a width of the first sensing electrode, and a first sensing line connected to the first sensing electrode and a second sensing line connected to the second sensing electrode are connected to a lower edge of the first sensing electrode and a lower edge of the second sensing electrode, respectively,
   wherein the first to fourth driving electrodes are arranged in a first column in a first direction, the first and second sensing electrodes are arranged in a second column adjacent to the first column in the first direction, and fifth, sixth, seventh, and eighth driving electrodes are arranged in a third column,
   wherein widths of the fifth and seventh driving electrodes and widths of the sixth and eighth driving electrodes corresponding to a third sensing electrode and a fourth sensing electrode respectively are different from widths of the first and third driving electrodes and widths of the second and fourth driving electrodes respectively,
   wherein a plurality of openings are formed in at least one electrode of the first driving electrode and the first sensing electrode on a first surface of a non-conductive layer,
   wherein an emission surface of a light emitting area of the organic limiting emitting display is disposed in the openings on a second surface of a non-conductive layer opposite the first surface of the non-conductive layer, an edge of the emission surface being separated from an edge of the at least one electrode by a predetermined interval at a minimum in a horizontal direction, and wherein the predetermined interval corresponds to one half of a sum of a thickness of the at least one electrode and a distance from an upper surface of the emission surface to a lower surface of the at least one electrode.

2. The organic light emitting display device according to claim 1, wherein a color filter is disposed below the openings.

3. The organic light emitting display device according to claim 1, wherein the openings are covered by a color filter.

4. The organic light emitting display device according to claim 1, wherein the first driving electrode and the first sensing electrode are disposed between a first film and a second film.

5. An organic light emitting display device comprising:
a display device;
a driving electrode disposed on the display device and including a first driving electrode and a second driving electrode which are driven by a first driving signal;
a sensing electrode disposed on the display device and including a first sensing electrode configured to correspond to the first driving electrode and output a first sensing signal corresponding to the first driving signal and a second sensing electrode configured to correspond to the second driving electrode and output a second sensing signal corresponding to the first driving signal; and
a touch driver integrated circuit (IC) configured to transmit the first driving signal to the first and second driving electrodes and receive the first sensing signal and the second sensing signal from the first and second sensing electrodes,
wherein a width of the second sensing electrode is narrower than a width of the first sensing electrode, and a first sensing line connected to the first sensing electrode and a second sensing line connected to the second sensing electrode are connected to a lower edge of the first sensing electrode and a lower edge of the second sensing electrode, respectively, and wherein the driving electrode further includes a third driving electrode adjacent to the first driving electrode and a fourth driving electrode adjacent to the second driving electrode, which are driven by a second driving signal, the first sensing electrode outputs a third sensing signal corresponding to the second driving signal, and the second sensing electrode outputs a fourth sensing signal corresponding to the second driving signal,
wherein the first to fourth driving electrodes are arranged in a first column in a first direction, sensing electrodes are arranged in a second column adjacent to the first column in the first direction, and fifth, sixth, seventh, and eighth driving electrodes are arranged in a third column,
wherein widths of the fifth and seventh driving electrodes and widths of the sixth and eighth driving electrodes corresponding to a third sensing electrode and a fourth sensing electrode respectively are different from widths of the first and third driving electrodes and widths of the second and fourth driving electrodes respectively,
wherein a plurality of openings are formed in at least one electrode of the driving electrode and the sensing electrode on a first surface of a non-conductive layer,
wherein an emission surface of a light emitting area of the organic limiting emitting display is disposed in the openings on a second surface of a non-conductive layer opposite the first surface of the non-conductive layer, an edge of the emission surface being separated from an edge of the at least one electrode by a predetermined interval at a minimum in a horizontal direction, and
wherein the predetermined interval corresponds to one half of a sum of a thickness of the at least one electrode and a distance from an upper surface of the emission surface to a lower surface of the at least one electrode.

6. The organic light emitting display device according to claim 5, wherein a color filter is disposed below the openings.

7. The organic light emitting display device according to claim 5, wherein the openings are covered by a color filter.

8. The organic light emitting display device according to claim 5, wherein the first driving electrode and the first sensing electrode are disposed between a first film and a second film.

9. An organic light emitting display device comprising:
a first driving electrode disposed on a portion of a first area of a display device;
a second driving electrode disposed on a portion of a second area of the display device and connected to the first driving electrode;
a third driving electrode disposed on a portion of a third area of the display device adjacent to the first area;
a fourth driving electrode disposed on a portion of a fourth area of the display device adjacent to the second area and connected to the third driving electrode;
a first sensing electrode disposed on another portion of the first area and another portion of the third area and configured to correspond to the first driving electrode and the third driving electrode;
a second sensing electrode disposed on another portion of the second area and another portion of the fourth area and configured to correspond to the second driving electrode and the fourth driving electrode;
a routing line connecting the first driving electrode and the second driving electrode;
a touch driver integrated circuit applying a driving signal; and
a driving line connecting the second driving electrode to the touch driver integrated circuit,
wherein a width of the second sensing electrode is narrower than a width of the first sensing electrode, and a first sensing line connected to the first sensing electrode and a second sensing line connected to the second sensing electrode are connected to a lower edge of the first sensing electrode and a lower edge of the second sensing electrode, respectively,
wherein one end of the routing line is connected to one side edge of the second driving electrode,
wherein one end of the driving line is connected to another side edge of the second driving electrode, which faces the one side edge, and is adjacent to a narrow width portion of the second sensing electrode,
wherein a plurality of openings are formed in at least one electrode of the first driving electrode and the first sensing electrode on a first surface of a non-conductive layer,
wherein an emission surface of a light emitting area of the organic limiting emitting display is disposed in the openings on a second surface of a non-conductive layer opposite the first surface of the non-conductive layer, an edge of the emission surface being separated from an edge of the at least one electrode by a predetermined interval at a minimum in a horizontal direction, and
wherein the predetermined interval corresponds to one half of a sum of a thickness of the at least one electrode and a distance from an upper surface of the emission surface to a lower surface of the at least one electrode.

10. An organic light emitting display device comprising:
a first driving electrode disposed on a portion of a first area of a display device;
a second driving electrode disposed on a portion of a second area of the display device and connected to the first driving electrode;
a third driving electrode disposed on a portion of a third area of the display device adjacent to the first area;
a fourth driving electrode disposed on a portion of a fourth area of the display device adjacent to the second area and connected to the third driving electrode;
a first sensing electrode disposed on another portion of the first area and another portion of the third area and configured to correspond to the first driving electrode and the third driving electrode; and
a second sensing electrode disposed on another portion of the second area and another portion of the fourth area and configured to correspond to the second driving electrode and the fourth driving electrode,
wherein a plurality of openings are formed in at least one electrode of the first driving electrode and the first sensing electrode on a first surface of a non-conductive layer,
wherein an emission surface of a light emitting area of the organic limiting emitting display is disposed in the openings on a second surface of a non-conductive layer opposite the first surface of the non-conductive layer, an edge of the emission surface being separated from an edge of the at least one electrode by a predetermined interval at a minimum in a horizontal direction, and
wherein the predetermined interval corresponds to one half of a sum of a thickness of the at least one electrode and a distance from an upper surface of the emission surface to a lower surface of the at least one electrode.

\* \* \* \* \*